(12) United States Patent
Hayashi et al.

(10) Patent No.: US 11,081,638 B2
(45) Date of Patent: Aug. 3, 2021

(54) PIEZOELECTRIC ELEMENT, VIBRATOR, VIBRATION WAVE MOTOR, OPTICAL APPARATUS, AND ELECTRONIC APPARATUS

(71) Applicant: CANON KABUSHIKI KAISHA, Tokyo (JP)

(72) Inventors: Jumpei Hayashi, Yokohama (JP); Makoto Kubota, Yokohama (JP); Shinya Koyama, Tokyo (JP); Tatsuo Furuta, Machida (JP); Kanako Oshima, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 64 days.

(21) Appl. No.: 16/029,434

(22) Filed: Jul. 6, 2018

(65) Prior Publication Data

US 2019/0019940 A1   Jan. 17, 2019

(30) Foreign Application Priority Data

Jul. 13, 2017   (JP) .............................. JP2017-137179

(51) Int. Cl.
*G02B 7/04*      (2021.01)
*H01L 41/083*    (2006.01)
(Continued)

(52) U.S. Cl.
CPC ............ *H01L 41/1871* (2013.01); *G02B 7/04* (2013.01); *G02B 7/08* (2013.01); *H01L 41/0471* (2013.01); *H01L 41/0835* (2013.01); *H01L 41/257* (2013.01); *H01L 41/273* (2013.01); *H01L 41/297* (2013.01); *H02N 2/103* (2013.01); *H02N 2/106* (2013.01); *H02N 2/22* (2013.01)

(58) Field of Classification Search
CPC ............. H01L 41/1871; H01L 41/0471; H01L 41/0835; H01L 41/257; H01L 41/273; H01L 41/297; G02B 7/04; G02B 7/08; H02N 2/103; H02N 2/106; H02N 2/22
USPC ........................................................ 359/824
See application file for complete search history.

(56) References Cited

U.S. PATENT DOCUMENTS 6,323,582 B1 * 11/2001  Takeuchi ................ H01L 41/43
                                                  310/328
7,005,776 B1 *  2/2006  Iino ..................... H01L 41/0913
                                                  310/316.01
(Continued)

FOREIGN PATENT DOCUMENTS

JP           8-213664 A      8/1996

OTHER PUBLICATIONS

Wei Li et al.; Piezoelectric and Dielectric Properties of (Ba1-xCax)(Ti0.95Zr0.05)O3 Lead-Free Ceramics; Journal of American Ceramics Society, vol. 93, No. 10; Oct. 2010; pp. 2942-2944.

*Primary Examiner* — James R Greece
(74) *Attorney, Agent, or Firm* — Canon U.S.A., Inc. IP Division

(57) ABSTRACT

A piezoelectric element includes a piezoelectric material layer and an electrode layer, wherein the piezoelectric material layer and the electrode layer are stacked on top of each other, the piezoelectric material layer includes a barium titanate-based material, and two coercive fields Ec1 and Ec2 of the piezoelectric element have the same sign and satisfy $(|Ec2|-|Ec1|) \geq 8$ kV/cm.

14 Claims, 11 Drawing Sheets

(51) Int. Cl.
  *H01L 41/187* (2006.01)
  *H01L 41/257* (2013.01)
  *H01L 41/297* (2013.01)
  *H01L 41/273* (2013.01)
  *H02N 2/10* (2006.01)
  *H01L 41/047* (2006.01)
  *H02N 2/00* (2006.01)
  *G02B 7/08* (2021.01)

(56) References Cited

U.S. PATENT DOCUMENTS

| | | | | |
|---|---|---|---|---|
| 9,276,193 | B2* | 3/2016 | Sumi | H01L 41/1871 |
| 9,324,933 | B2* | 4/2016 | Sumi | C04B 35/4682 |
| 2002/0121843 | A1* | 9/2002 | Takeuchi | G02B 26/0858 |
| | | | | 310/330 |
| 2004/0104689 | A1* | 6/2004 | Takeuchi | H01J 1/30 |
| | | | | 315/169.4 |
| 2008/0178443 | A1* | 7/2008 | Tokukura | B41J 2/161 |
| | | | | 29/25.35 |
| 2010/0079555 | A1* | 4/2010 | Arakawa | B41J 2/161 |
| | | | | 347/68 |
| 2010/0253749 | A1* | 10/2010 | Arakawa | B41J 2/14233 |
| | | | | 347/68 |
| 2011/0074888 | A1* | 3/2011 | Fujii | B41J 2/04581 |
| | | | | 347/68 |
| 2013/0215174 | A1* | 8/2013 | Konishi | B41J 2/04588 |
| | | | | 347/10 |
| 2013/0229464 | A1* | 9/2013 | Nawano | B41J 2/1628 |
| | | | | 347/68 |
| 2013/0250417 | A1* | 9/2013 | Ohashi | H01L 41/0973 |
| | | | | 359/507 |
| 2013/0335488 | A1* | 12/2013 | Watanabe | B41J 2/14233 |
| | | | | 347/70 |
| 2014/0125199 | A1* | 5/2014 | Furuta | H01L 41/047 |
| | | | | 310/323.06 |
| 2014/0152144 | A1* | 6/2014 | Watanabe | H01L 41/1873 |
| | | | | 310/311 |
| 2014/0218588 | A1* | 8/2014 | Ifuku | H04N 5/2171 |
| | | | | 348/340 |
| 2015/0221857 | A1* | 8/2015 | Watanabe | H02N 2/183 |
| | | | | 252/62.9 PZ |
| 2015/0229238 | A1* | 8/2015 | Hirose | H02N 2/0075 |
| | | | | 318/116 |
| 2015/0288298 | A1* | 10/2015 | Uebayashi | G02B 7/04 |
| | | | | 310/317 |
| 2015/0349666 | A1* | 12/2015 | Ifuku | H01L 41/257 |
| | | | | 310/323.06 |
| 2015/0353431 | A1* | 12/2015 | Ueda | C04B 35/62685 |
| | | | | 347/68 |
| 2015/0372219 | A1* | 12/2015 | Yamashita | H01L 41/41 |
| | | | | 310/334 |
| 2016/0141486 | A1* | 5/2016 | Masai | H01L 41/0805 |
| | | | | 310/311 |
| 2016/0284972 | A1* | 9/2016 | Kojima | H01L 41/098 |
| 2016/0372654 | A1* | 12/2016 | Ikeuchi | H01L 41/0805 |

* cited by examiner

PIEZOELECTRIC ELEMENT, VIBRATOR, VIBRATION WAVE MOTOR, OPTICAL APPARATUS, AND ELECTRONIC APPARATUS

BACKGROUND OF THE INVENTION

Field of the Invention

The aspect of the embodiments relates to a piezoelectric element, a vibrator using the piezoelectric element, a vibration wave motor, an optical apparatus, and an electronic apparatus.

Description of the Related Art

A piezoelectric element includes a piezoelectric material layer and an electrode layer stacked on top of each other. In particular, a laminated piezoelectric element including a plurality of piezoelectric material layers and a plurality of electrode layers stacked on top of each other makes it possible to obtain a large deformation with a low voltage. Attaching an elastic member for amplifying a vibration to a piezoelectric element forms a vibrator which is usable for various actuators. For example, a vibration wave motor includes a vibrator and a moving member attached to the vibrator in which the moving member rotatably moves by a voltage.

Japanese Patent Application Laid-Open No. 8-213664 discusses a piezoelectric element including piezoelectric material layers made of lead zirconate titanate (hereafter referred to as PZT). Since PZT contains lead as the main component, its influence on environment has been regarded as an issue. When PZT is discarded, lead components melt into soil possibly causing damage to an ecosystem. For this reason, a piezoelectric element made of what is called a non-lead piezoelectric material not containing lead is being considered (hereinafter such an element is referred to as a non-lead-based piezoelectric element).

Meanwhile, a barium titanate-based material is highly anticipated as a non-lead piezoelectric material. "*Journal of American Ceramics Society*" 2010 Vol. 93 No. 10 pp. 2942-2944 discusses a barium titanate-based material having a high piezoelectric constant.

However, the barium titanate-based material discussed in "*Journal of American Ceramics Society*" 2010 Vol. 93 No. 10 pp. 2942-2944 provides weak coercive fields and accordingly a large amount of electric loss results from piezoelectric material layers. This has been a cause of a situation that a preferable driving efficiency cannot be obtained.

SUMMARY OF THE INVENTION

A piezoelectric element which includes a piezoelectric material layer and an electrode layer, wherein the piezoelectric material layer and the electrode layer are stacked on top of each other, the piezoelectric material layer includes a barium titanate-based material, and two coercive fields Ec1 and Ec2 of the piezoelectric element have the same sign and satisfy (|Ec2|−|Ec1|)≥8 kV/cm.

Further features of the present disclosure will become apparent from the following description of exemplary embodiments with reference to the attached drawings.

DESCRIPTION OF THE EMBODIMENTS

A piezoelectric element of the disclosure includes a piezoelectric material layer, and an electrode layer. The piezoelectric material layer and the electrode layer are stacked on top of each other. The piezoelectric material layer includes a barium titanate-based material. Two coercive fields Ec1 and Ec2 of the piezoelectric element have the same sign and satisfy (|Ec2|−|Ec1|)≥8 kV/cm.

If this condition is met, an electric field at which the polarization switching of the piezoelectric element occurs is high enough to allow application of a strong electric field to the piezoelectric element. This means that the piezoelectric element of the disclosure is excellent in dielectric strength. Because power consumption due to current component generated by polarization switching is low, the piezoelectric element of the disclosure can be driven with a driving efficiency. In one embodiment, a driving efficiency means low power consumption at a desired speed or a large ratio of the mechanical output to the input power of the motor.

Although the means for achieving the disclosure is not particularly limited, the value of the (|Ec2|−|Ec1|) can be varied with the composition of a barium titanate-based material, the maximum baking temperature of the piezoelectric element, and the clamping pressure of a first nut (described below).

The piezoelectric element of the disclosure includes piezoelectric material layers and electrode layers alternately stacked on top of each other.

Figure 1:
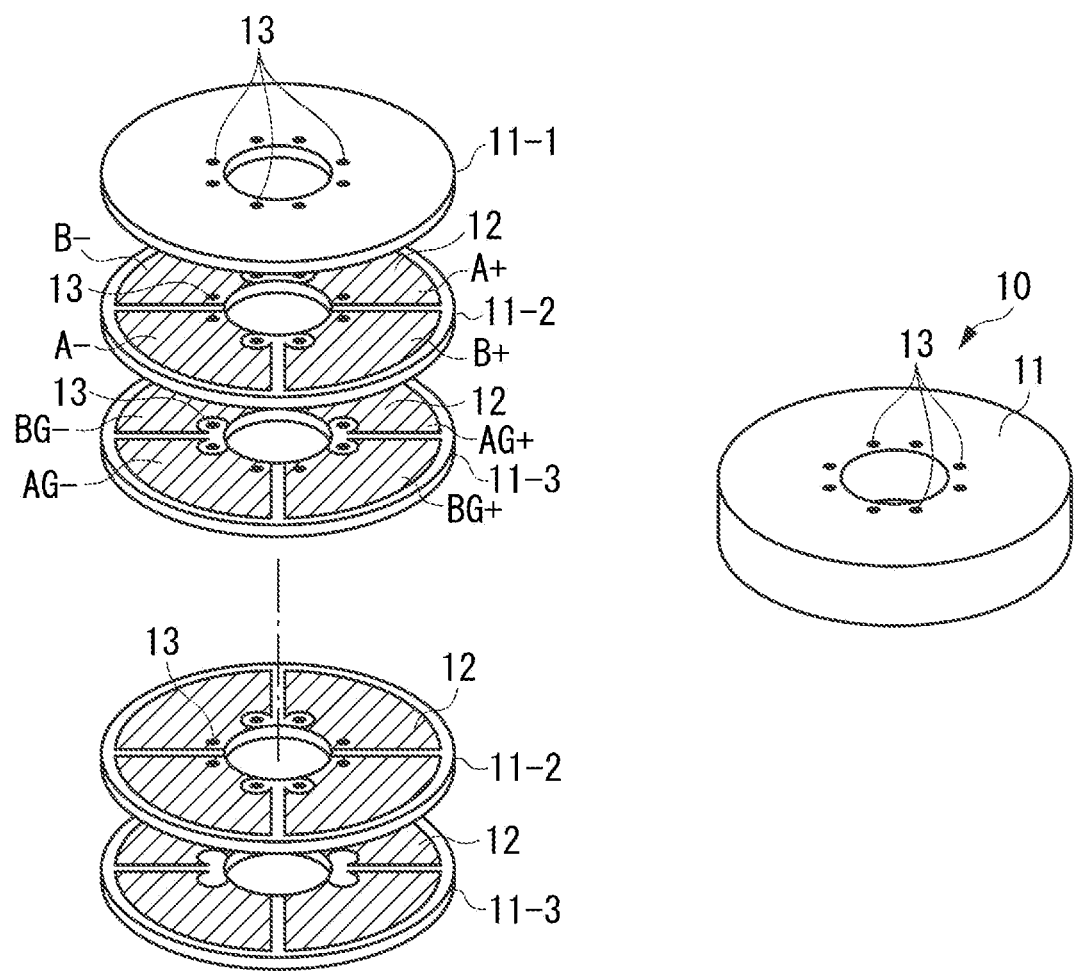
FIG. 1 is a sectional view schematically illustrating a piezoelectric element according to an exemplary embodiment of the disclosure.

FIG. 1 is a sectional view schematically illustrating a piezoelectric element according to an exemplary embodiment of the disclosure. Referring to FIG. 1, the piezoelectric element includes piezoelectric material layers 11-1, 11-2, 11-3, . . . , 11-2, and 11-3 and metal electrode layers 12 (electrode layers made of metal) alternately stacked on top of each other. On the surface of the piezoelectric material layer 11-2, the metal electrode layer 12 is divided into four in the circumferential direction of the piezoelectric material layers to form electrodes A+, A−, B+, and B− which are not conductive with each other. On the surface of the piezoelectric material layer 11-3, the metal electrode layer 12 is divided into four in the circumferential direction of the piezoelectric material layers to form electrodes AG+, AG−, BG+, and BG− (G denotes ground) which are not conductive with each other.

The metal electrodes A+, A−, B+, and B− formed on the piezoelectric material layer 11-2 are electrically connected with the internal electrodes AG+, AG−, BG+, and BG− formed on the piezoelectric material layer 11-3, respectively, through eight through-holes 13 which reach the surface of the piezoelectric material layer 11-1. After performing the above-described processing, a poling procedure is performed on two metal electrodes in a 180-degree positional relation out of four division metal electrodes in terms of specific temperature, field polarity, field intensity, and duration so as to differentiate the polarization direction between the two metal electrodes.

The polarization-field hysteresis characteristics (described below) can be measured through voltage application to any one phase of the electrodes A+ and AG+, A− and AG−, B+ and BG+, and B− and BG−.

The piezoelectric material layers are made of a barium titanate-based material. The barium titanate-based material presents a high piezoelectric constant without substantially using lead components (1000 parts per million (ppm) or less) and is beneficial in ease of characteristic adjustment, for example, by increasing the mechanical quality factor and reducing the dielectric loss tangent with a small amount of an additive. The barium titanate-based material refers to such a composition as barium titanate ($BaTiO_3$), barium titanate calcium ($(Ba, Ca)TiO_3$), titanic acid zirconic acid barium ($Ba(Ti, Zr)O_3$), titanic acid zirconic acid barium calcium ($(Ba, Ca) (Ti, Zr))O_3$), niobic acid sodium-barium titanate ($NaNbO_3$—$BaTiO_3$), titanic acid bismuth sodium-barium titanate (($Bi, Na)TiO_3$—$BaTiO_3$), and titanic acid bismuth potassium-barium titanate (($Bi, K)TiO_3$—$BaTiO_3$), or a material containing these compositions as the main component (having a content of 51 weight percent or more to the gross weight of the piezoelectric material). From the viewpoint of obtaining both a high piezoelectric constant and a high mechanical quality factor of the piezoelectric material layers, in one embodiment, the above-described barium titanate-based material contains an oxide (containing Ba, Ca, Ti, and Zr), Mn, and Bi out of the above-described compositions. With the increase in the piezoelectric constant and mechanical quality factor of the piezoelectric material layers, the admittance of the piezoelectric element increases to enable obtaining a large displacement. In addition, the dielectric loss tangent of the piezoelectric element decreases to improve the driving efficiency, thus decreasing power consumption of a device. The composition of the piezoelectric material layers can be obtained by using such methods as X-ray fluorescence spectrocopy (XRF), inductively coupled plasma (ICP) optical emission spectroscopy, and atomic absorption spectrometry.

With an oxide containing the Ba, Ca, Ti, and Zr, the mole ratio x of the Ca to the sum of the Ba and the Ca satisfies $0.02 \leq x \leq 0.30$, and the mole ratio y of the Zr to the sum of the Ti and the Zr satisfies $0.01 \leq y \leq 0.10$. The content of the Mn to 100 parts by mass of the oxide is 0.02 parts by mass or more and 0.40 parts by mass or less in terms of metal.

If the value of x falls within this range, the difference between coercive fields Ec1 and Ec2 (|Ec2|−|Ec1|) can be further increased. This makes it possible to drive the piezoelectric element without degrading the driving efficiency even when a stronger electric field is applied to the piezoelectric element. In one embodiment, the value of x satisfies $0.10 \leq x \leq 0.20$.

If the value of y falls within this range, the admittance of the piezoelectric element can be increased without decreasing the value of the (|Ec2|−|Ec1|). As a result, the displacement and vibration velocity of the piezoelectric element can be increased. In one embodiment, the value of y is $0.02 \leq y \leq 0.07$.

If the content of Mn falls within this range, the dielectric loss tangent of the piezoelectric element decreases making it possible to increase the driving efficiency. Further, in one embodiment, the content of Mn is 0.10 parts by mass or more and 0.40 parts by mass or less.

The content of Mn "in terms of metal" is measured as follows. First of all, an element constituting the above-described metal oxide is detected based on the content of the element of the piezoelectric material layer through X-ray fluorescence spectrocopy, ICP optical emission spectroscopy, and atomic absorption spectrometry, and converted into a perovskite type oxide. When the gross weight is set to 100, the content of Mn is represented by the ratio of the weight of element Mn to the gross weight.

Although the thickness of one piezoelectric material layer is not particularly limited, in one embodiment, the thickness is 20 μm or more and 100 μm or less from the viewpoint of ease of design and manufacture of a piezoelectric element. If the thickness is less than 20 μm, to increase the admittance of the piezoelectric element, the number of layers is to be increased. As a result, the number of metal electrode layers increases, possibly increasing the cost of metal electrode layers. On the other hand, when the thickness exceeds 100 μm, the voltage to obtain a large displacement of the piezoelectric element increases, possibly increasing the cost of the power source.

Although the size of a crystal grain in the piezoelectric material layers is not particularly limited, in one embodiment, the size is 4 to 20 μm in terms of the equivalent circular diameter from the viewpoint that the piezoelectric material layers can provide a large piezoelectric constant. The "equivalent circular diameter" represents the "project area equivalent circular diameter" (generally referred to in the microscope observation method) and represents the diameter of a perfect circle having the same area as the project area of a crystal grain. The "equivalent circular diameter" can be obtained, for example, by capturing a photographic image of a section of the piezoelectric element by using a scanning electron microscope (SEM) and then performing image processing on the captured image.

Although the material of the electrode layers is not particularly limited, in one embodiment, the material is a highly conductive metal that can be baked simultaneously with the piezoelectric material layers. With the barium titanate-based material, the maximum temperature to obtain a sintered product having a precise density (for example, a relative density of 90% or more) is approximately 1150 to 1350° C. In one embodiment, the barium titanate-based material does not melt at the maximum temperature. Materials for metal electrode layers satisfying these conditions include nickel, platinum, and a silver-palladium alloy. From the viewpoint of low cost, a silver-palladium alloy is desirable. A desirable weight ratio of the content weight M1 of silver to the content weight M2 of palladium satisfies 0.25≤M1/M2≤4.0. If the weight ratio falls within this range, the metal electrode layers are desirable from the viewpoint of conductivity, shape homogeneity, and cost.

Although the thickness of one electrode layer is not particularly limited, in one embodiment, the thickness is 1 μm or more and 10 μm or less from the viewpoint of the displacement and vibration performance of the piezoelectric material layers. More desirably, the thickness is 3.5 μm or more from the viewpoint of the improvement in conductivity of the electrode layers.

Figure 2:
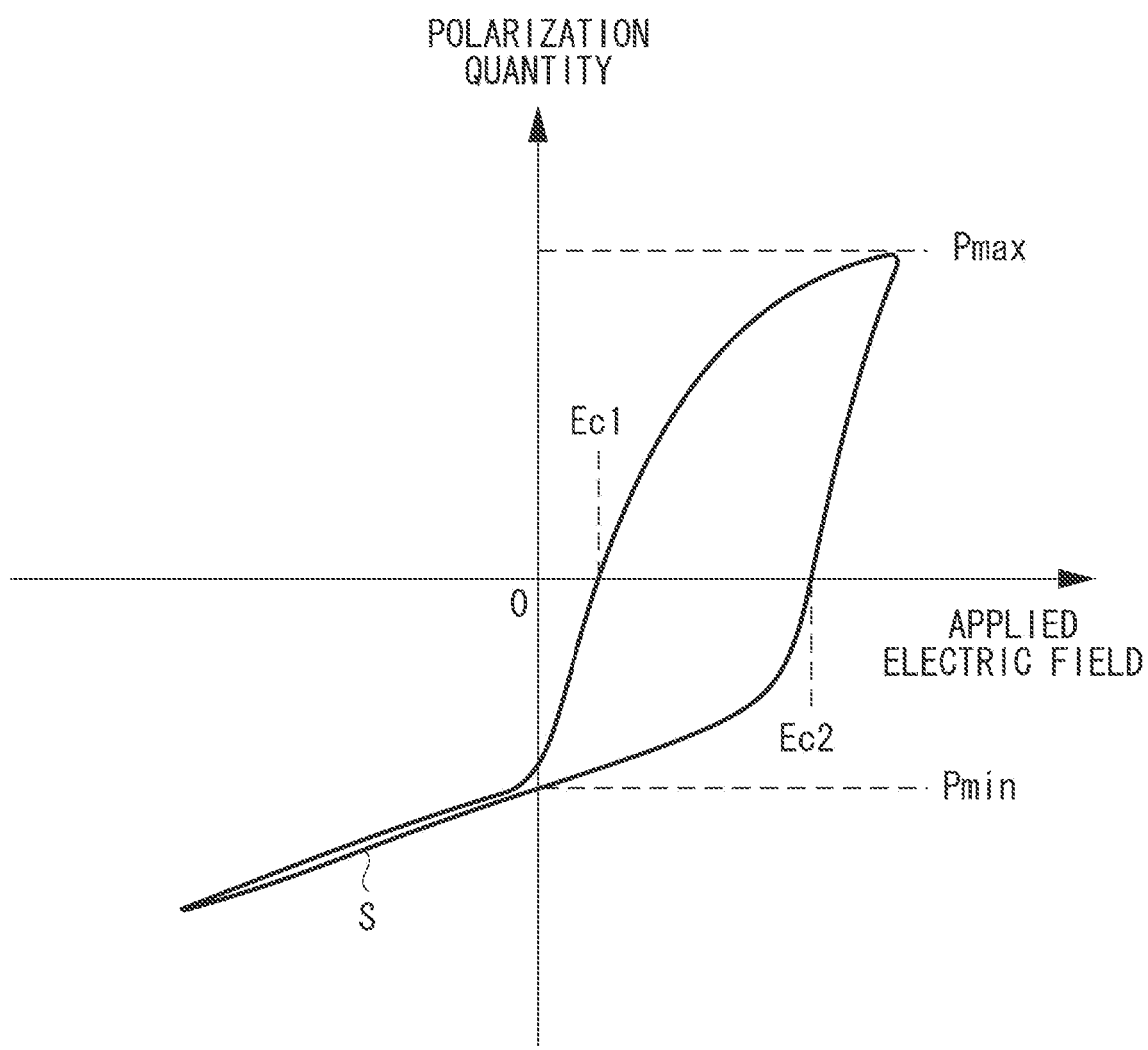
FIG. 2 is a schematic view illustrating the polarization-field hysteresis characteristics of the piezoelectric element according to an exemplary embodiment of the disclosure.

The piezoelectric element of the disclosure is provided with the polarization-field hysteresis characteristics. FIG. 2 is a schematic view illustrating the polarization-field hysteresis characteristics of the piezoelectric element according to an exemplary embodiment of the disclosure.

The polarization-field hysteresis characteristics refer to a hysteresis effect in the relation between an alternating current (AC) field applied to a ferroelectric material and polarization quantity generated by the ferroelectric material.

Referring to FIG. 2, the horizontal axis represents an applied field which equals the voltage value applied to the piezoelectric element divided by the thickness of one piezoelectric material layer of the piezoelectric element. The polarization-field hysteresis characteristics when the value of the applied field is positive are referred to as a positive field polarity and the polarization-field hysteresis characteristics when the value of the applied field is negative are referred to as a negative field polarity. The polarization quantity represented by the vertical axis is the surface charge generated by the polarization in a piezoelectric material layer produced through voltage application to the piezoelectric element divided by the area of a metal electrode layer. The voltage application is performed on any one phase of the electrodes A+ and AG+, A− and AG−, B+ and BG+, and B− and BG−.

Referring to FIG. 2, the values of two electric fields with the zero polarization quantity are referred to as coercive fields. The values of the electric fields in this case are called coercive fields Ec1 and Ec2. In a hysteresis loop indicating the polarization-field hysteresis characteristics, the region surrounded by a loop having the field polarity different from the field polarity in which the coercive fields Ec1 and Ec2 are located has an area S. Referring to FIG. 2, more specifically, S denotes the area of the portion surrounded by the loop of the region with a negative applied field and the axis of the zero applied field.

The maximum and the minimum values of the polarization quantity having the same field polarity as the coercive fields Ec1 and Ec2 are referred to as Pmax and Pmin, respectively. More specifically, Pmax and Pmin are equivalent to the maximum and the minimum polarization quantities in the hysteresis loop corresponding to the portion of the positive applied field, respectively, in FIG. 2.

Figure 3:
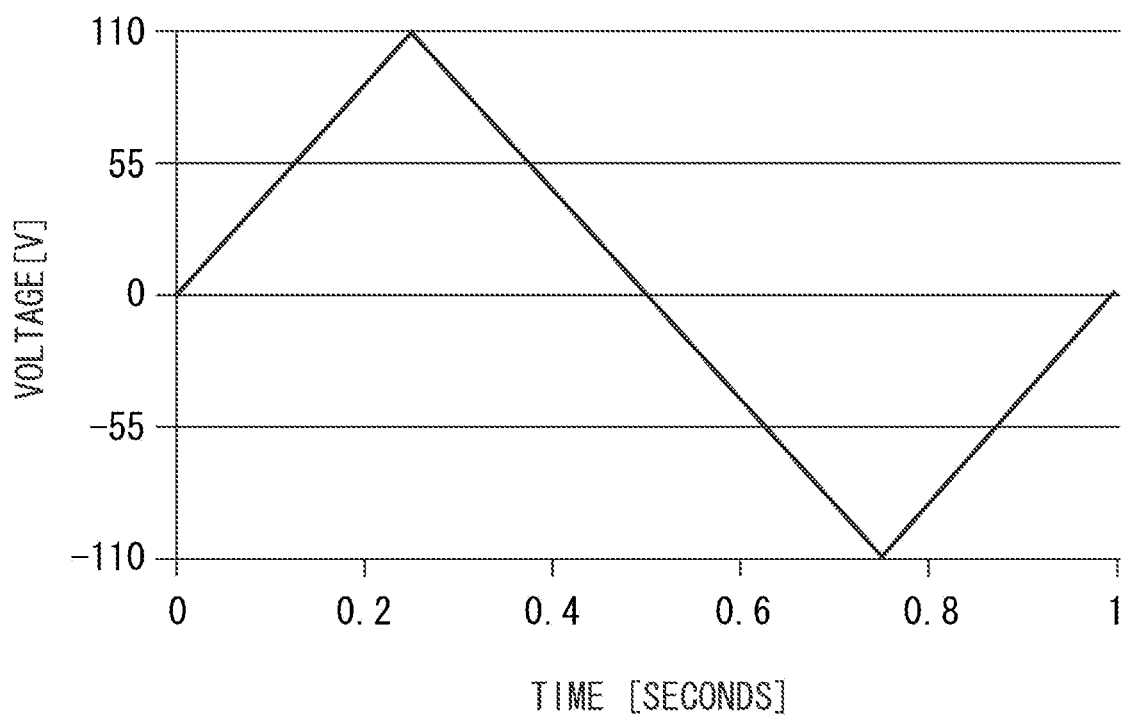
FIG. 3 illustrates a waveform of a voltage applied to measure the polarization-field hysteresis characteristics of the piezoelectric element of the disclosure.

A method for measuring the polarization-field hysteresis characteristics will be specifically described below. FIG. 3 is a waveform chart illustrating a voltage applied to measure the polarization-field hysteresis characteristics of the piezoelectric element of the disclosure. The thickness of one piezoelectric material layer of the piezoelectric element is 55 μm. The applied voltage is a triangle wave having a frequency of 1 Hz and an amplitude of 110 $V_{p0}$. A 110-$V_{p0}$ voltage is applied to a 55-μm piezoelectric material layer. This means that the polarization-field hysteresis characteristics are obtained by sweeping the applied field from −20 to 20 kV/cm. The polarization-field hysteresis characteristics were measured 10 times by using an evaluation apparatus such as a common ferroelectric material evaluation apparatus, and the average value was taken as a measured value.

With the piezoelectric element of the disclosure, both of the two coercive fields in the polarization-field hysteresis characteristics (hysteresis loop) when the applied field is swept from −20 to 20 kV/cm are located in the same field polarity. When both of the two coercive fields are located in the same field polarity, it becomes possible to drive the piezoelectric element with a high driving efficiency by applying a voltage to only one field polarity. In other words, the two coercive fields located in the same field polarity have the same sign.

Figure 4:
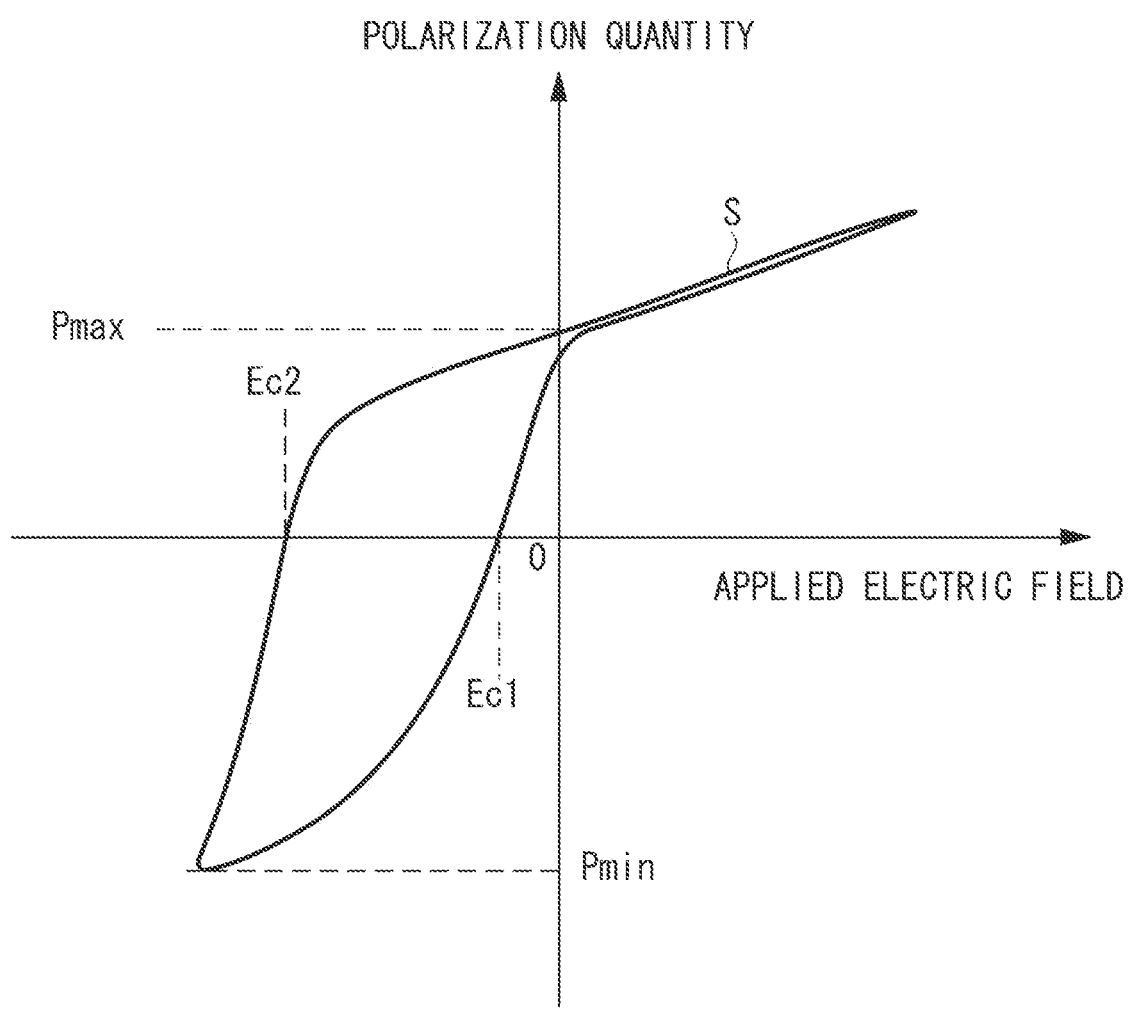
FIG. 4 is a schematic view illustrating the polarization-field hysteresis characteristics of the piezoelectric element according to an exemplary embodiment of the disclosure.

In the polarization-field hysteresis characteristics illustrated in FIG. 2, both of the two coercive fields are located in the positive field polarity. FIG. 4 is a schematic view illustrating the polarization-field hysteresis characteristics of the piezoelectric element according to an exemplary embodiment of the disclosure when a voltage having the opposite polarity to the voltage illustrated in FIG. 2 is applied to the piezoelectric element. Both of the two coercive fields are located in the negative field polarity. In other words, FIG. 4 illustrates a hysteresis loop when the electric field illustrated in FIG. 3 is applied to the piezoelectric element having the opposite polarization-axis polarity produced as a result of performing the poling procedure on the piezoelectric material.

In the polarization-field hysteresis characteristics of the piezoelectric element of the disclosure, the field polarity in which the two coercive field are located changes according to the polarity (positive or negative) of the applied voltage.

With the piezoelectric element of the disclosure having the polarization-field hysteresis characteristics when the applied field is swept from −20 to 20 kV/cm, the above-described two coercive fields Ec1 and Ec2 (|Ec2|>|Ec1|) satisfy (|Ec2|−|Ec1|)≥8 kV/cm. If this condition is met, the electric field at which a current resulting from the polarization switching of the piezoelectric element is generated is high enough to allow application of a stronger electric field to the piezoelectric element. This means that the piezoelectric element is excellent in dielectric strength to the applied voltage. As a result, it is possible to obtain a piezoelectric element which achieves low power consumption resulting from the above-described current component and can be driven with a high efficiency. A more desirable value of (|Ec2|−|Ec1|) is 11 kV/cm or more.

If the value of (|Ec2|−|Ec1|) is less than 8 kV/cm, a current is produced by the polarization switching of the piezoelectric element from the time when a low electric field is applied, resulting an increase in power consumption. In addition, a temperature rise by self-heating occurs during operation. Since the barium titanate-based material generally has a lower Curie temperature than PZT, depolarization may occur if a temperature rise by self-heating continues. Therefore, to achieve a high driving efficiency by using a piezoelectric element made of a barium titanate-based material, the value of (|Ec2|−|Ec1|) is to be sufficiently large.

With the piezoelectric element of the disclosure, in one embodiment, the value of the |Ec2| is 10 kV/cm or more. If the value of the |Ec2| is 10 kV/cm or more, it is possible to raise a value of the electric field at which the current resulting from the polarization switching of the piezoelectric element is generated, which then allows a stronger electric field to be applied to the piezoelectric element. This makes it possible to obtain drive characteristics with an efficiency equivalent to that of a lead-based piezoelectric element. A more desirable value of |Ec2| is 14 kV/cm or more.

In the hysteresis loop of the piezoelectric element according to the disclosure, in one embodiment, the area S surrounded by a hysteresis loop having the different field polarity from the above-described coercive fields Ec1 and Ec2 and the axis of the zero field satisfies S≤5 mV·C/m³.

The area S of the hysteresis loop has a correlation with the value of the dielectric loss tangent when the piezoelectric element is driven by a high electric field. This means that the smaller the area S is the less the electric loss of the piezoelectric element is. If this condition is met, it is possible to obtain a piezoelectric element which consumes less power, which would otherwise be consumed as a result of heat generation from the element itself through voltage application. Further, the piezoelectric element can be driven with a higher efficiency. A more desirable value of the area S of the hysteresis loop is 3 mV·C/m³ or less.

In the hysteresis loop of the piezoelectric element of the disclosure, in one embodiment, the maximum value Pmax and the minimum value Pmin of the polarization quantity in the field polarity in which the above-described coercive fields Ec1 and Ec2 are located satisfy (|Pmax−Pmin|)≥15 µC/cm².

The value of the (|Pmax−Pmin|) is proportional to the magnitude of distortion obtained when a voltage is applied to the piezoelectric element. This means that an increase in this value increases the displacement and vibration velocity of the piezoelectric element obtained, i.e., the piezoelectric element is excellent in displacement and vibration characteristics. If this condition is met, it is possible to obtain a target displacement and vibration velocity with a lower voltage, thus achieving a piezoelectric element that can be driven with a higher efficiency. A more desirable difference between the maximum value Pmax and the minimum value Pmin of the polarization quantity is 20 µC/cm² or more.

With the piezoelectric element of the disclosure, in one embodiment, the product of the (|Ec2|−|Ec1|) and the (|Pmax−Pmin|) is 120 kV·C/m³ or more.

Generally, a piezoelectric element made of a barium titanate-based material has a trade-off relation between the displacement and vibration characteristics and the dielectric strength. However, if this condition is met, the piezoelectric element of the disclosure can achieve both the displacement and vibration characteristics and the dielectric strength. A more desirable value of the product of (|Ec2|−|Ec1|) and (|Pmax−Pmin|) is 200 kV·C/m³ or more.

(Production Method of Piezoelectric Element)

A production method of the piezoelectric element according to the disclosure is not particularly limited. The production method will be described below.

First of all, a solvent is added to a powdered barium titanate-based material to obtain a slurry.

For the powdered barium titanate-based material, it is desirable to use calcined powder formed by calcining an oxide containing the Ba, Ca, Ti, and Zr components at temperature of approximately 800 to 1100° C. to prevent curvature or crack of a laminated element in the subsequent baking process. Calcined powder may also be obtained by calcining the above-described oxide with an added Mn oxide. The mixture ratio of the Ba, Ca, Ti and Zr components contained in the calcined powder is similar to that of a target metal oxide.

In order to lower the maximum baking temperature and increase the value of the (|Ec2|−|Ec1|), an auxiliary agent is added to this calcined powder. An auxiliary agent containing particulate $SiO_2$, $B_2O_3$, $Al_2O_3$, and $Na_2CO_3$ is desirable because of the lowered start temperature of the green sheet contraction accompanying the grain growth in the baking process. A desirable average particle diameter of particulate $SiO_2$, $B_2O_3$, $Al_2O_3$, and $Na_2CO_3$ is 0.5 µm or more and 2.0 µm or less.

A desirable addition rate of the auxiliary agent to the calcined powder is 0.05 parts by mass or more and 1.0 parts by mass or less. Limiting the addition rate of the auxiliary agent to the above-described range enables lowering the maximum baking temperature while increasing the value of the (|Ec2|−|Ec1|) of the piezoelectric element.

Examples of solvents to be added to the powdered barium titanate-based material include toluene, ethanol, acetic acid n-butyl, and water. The solvent is added to the above-described metal compound granular material and mixed by using a ball mill for 24 hours. Then, a binder and plasticizer are added. Examples of binders include polyvinyl alcohol (PVA), polyvinyl butyral (PVB), and acrylic resin. Examples of plasticizers include dioctyl sebacate, dioctyl phthalate, and dibutyl phthalate.

Then, the above-described slurry is placed on a base material, and a green sheet as a precursor of the piezoelectric material layer is obtained.

The green sheet is obtained by applying the slurry on the base material by using a doctor blade and then making it dry. Examples of base materials include a fluoride coat PET film. The thickness of the above-described green sheet is not particularly limited and can be adjusted according to the thickness of the target piezoelectric material.

Then, a metal electrode layer is formed on the green sheet.

Small holes to be used as through-holes are formed on the green sheet. Then, the holes formed on the green sheet are filled up with a paste made of a conductive powder material for forming electrode layers by using the screen printing method. Further, a paste made of a conductive powder material for forming electrode layers is printed on the surface of the green sheet by using the screen printing method.

A plurality of green sheets is sequentially stacked from the bottom upward, pressurized and heated by a heating and pressurizing apparatus for lamination. Thus, a laminated body before baking is formed.

The laminated body is baked under ambient atmosphere (of 1150 to 1350° C.). After baking, the poling procedure is performed on the baked body. As a poling procedure condition, for example, the baked body is heated to 60 to 150° C. and applied with an electric field of 1 to 2 kV/mm for approximately 10 to 60 minutes. The poling procedure is performed on the metal electrodes A+, A−, B+, B−, AG+, AG−, BG+, and BG− connected to the through-holes 13. More specifically, a positive voltage is applied to the electrodes A+ and B+, a negative voltage is applied to the electrodes A− and B−, and the electrodes AG+, AG−, BG+, and BG− are grounded. In the obtained piezoelectric element, the electrodes A+ and A− are referred to as phase A, and the electrodes B+, and B− are referred to as phase B.

The laminated-piezoelectric vibrator of the disclosure includes the above-described piezoelectric element, a first elastic member and a second elastic member for sandwiching the above-described piezoelectric element in the lamination direction, and a shaft penetrating the piezoelectric element and the first and the second elastic members.

Figure 5:
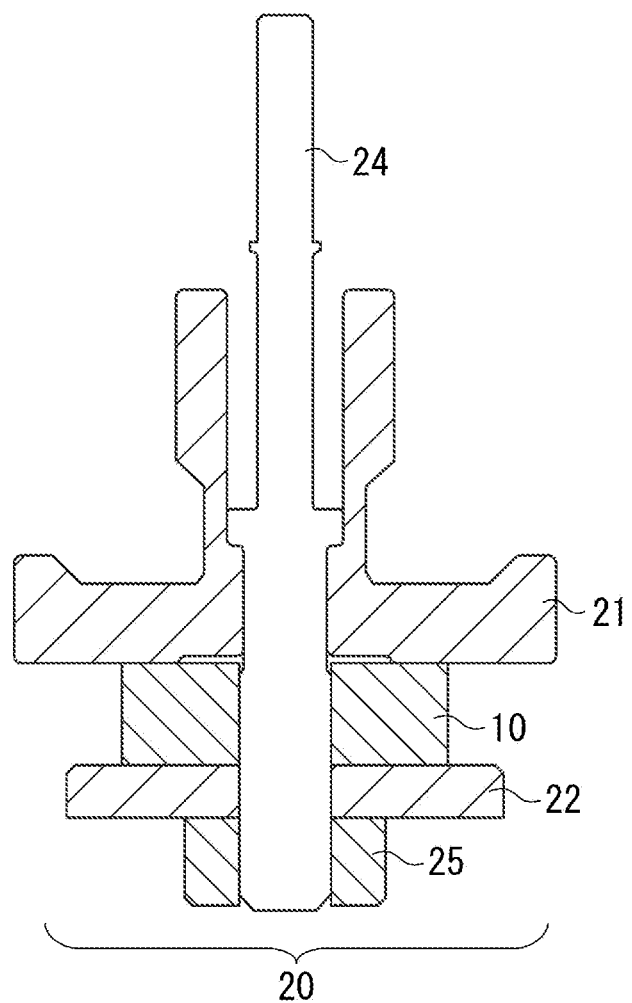
FIG. 5 is a sectional view illustrating an overall structure of a vibrator according to an exemplary embodiment of the disclosure.

FIG. 5 is a sectional view illustrating an overall structure of a vibrator according to an exemplary embodiment of the disclosure.

As illustrated in FIG. 5, a piezoelectric element 10 is sandwiched by a first elastic member 21 and a second elastic member 22 in the lamination direction of the piezoelectric element 10. The piezoelectric element 10 further includes a shaft 24 and a first nut 25.

The first elastic member 21 and the second elastic member 22 have a hole for inserting the shaft 24.

The shaft 24 penetrates the piezoelectric element 10, the first elastic member 21, and the second elastic member 22.

The first nut 25 is attached to the shaft 24.

The piezoelectric element 10 is bonded to the first elastic member 21 and the second elastic member 22 by using an adhesive. It is desirable to perform bonding while pressurizing the piezoelectric element 10 with pressure of 1 to 10 MPa. The piezoelectric element 10 is fastened by the shaft 24 and the first nut 25, and a predetermined compressive force is applied.

A vibration wave motor of the disclosure includes the above-described laminated-piezoelectric vibrator and a moving member in contact with the laminated-piezoelectric vibrator.

Figure 6:
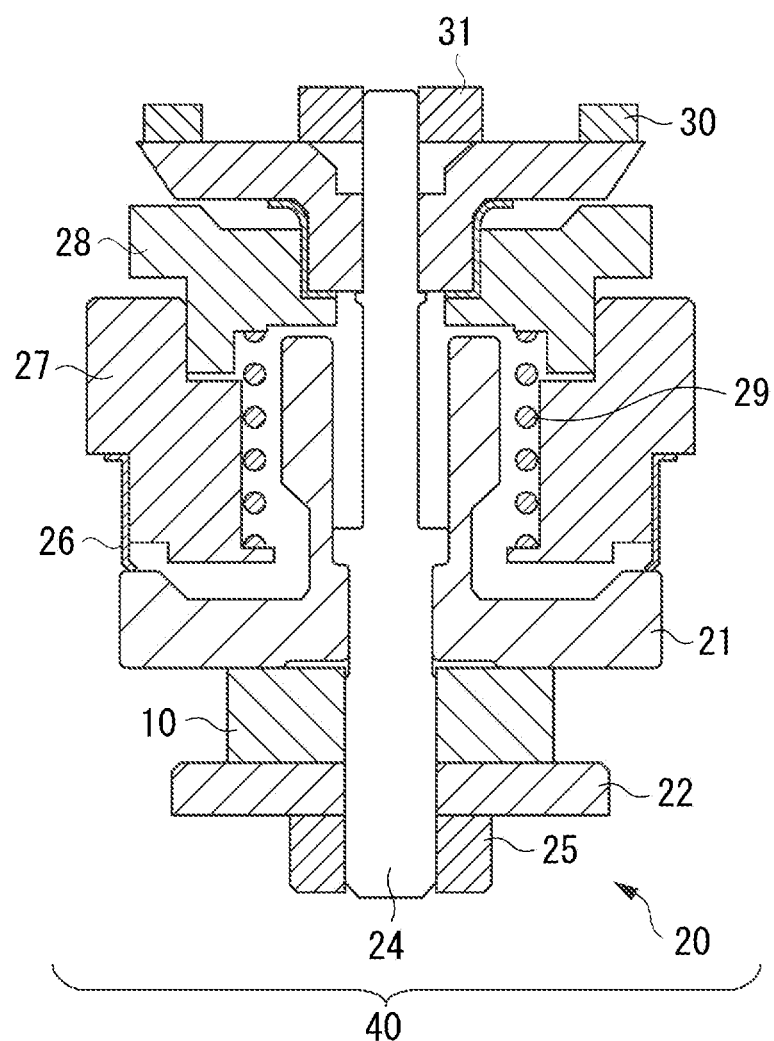
FIG. 6 is a sectional view illustrating an overall structure of a vibration wave motor according to an exemplary embodiment of the disclosure.

FIG. 6 is a sectional view illustrating an overall structure of the vibration wave motor according to an exemplary embodiment of the disclosure.

As illustrated in FIG. 6, a vibration wave motor 40 includes the piezoelectric element 10, the first elastic member 21, the second elastic member 22, the shaft 24, and the first nut 25 which constitute a laminated-piezoelectric vibrator 20. In addition to the laminated-piezoelectric vibrator 20, the vibration wave motor 40 further includes a rubber 26, a moving member 27, a gear 28, a pressurization spring 29, a flange 30, and a second nut 31.

The flange 30 is a member for attaching the vibration wave motor 40 to an external member (not illustrated) such as a frame of an apparatus on which the vibration wave motor 40 is to be mounted. The flange 30 is fixed to a predetermined position by the second nut 31. The lower end face of the rubber 26 contacts the upper surface of the first elastic member 21. The moving member 27 is fixed to the rubber 26. The gear 28 is disposed on the upper side of the moving member 27. A concave portion provided on the upper side of the moving member 27 is engaged with a convex portion provided on the lower side of the gear 28. The pressurization spring 29 is disposed between the moving member 27 and the gear 28. The spring force of the pressurization spring 29 determines the position of the gear 28 and downwardly pressurizes the moving member 27. Since the lower end face of the rubber 26 fixed to the moving member 27 is in pressure contact with the upper surface of the first elastic member 21, a predetermined frictional force is generated on the contact surface.

When an alternating voltage having a 90-degree phase difference from the metal electrodes A+ and A− is applied to the metal electrodes B+ and B− of the piezoelectric element 10, two different bending vibrations are generated. Thus, the bending vibration of the laminated-piezoelectric vibrator 20 rotates about the axis of the shaft 24. As a result, an elliptical movement is formed on the contact surface of the first elastic member 21 in contact with the rubber 26, driving force is generated, and the rubber 26 pressed onto the first elastic member 21 is frictionally driven. In this way, the rubber 26, the moving member 27, the gear 28, and the pressurization spring 29 integrally rotate about the axis of the shaft 24. This rotation is output to the outside of the vibration wave motor 40 via the gear 28.

The optical apparatus of the disclosure includes the above-described vibration wave motor 40 and an optical member.

Figure 7:
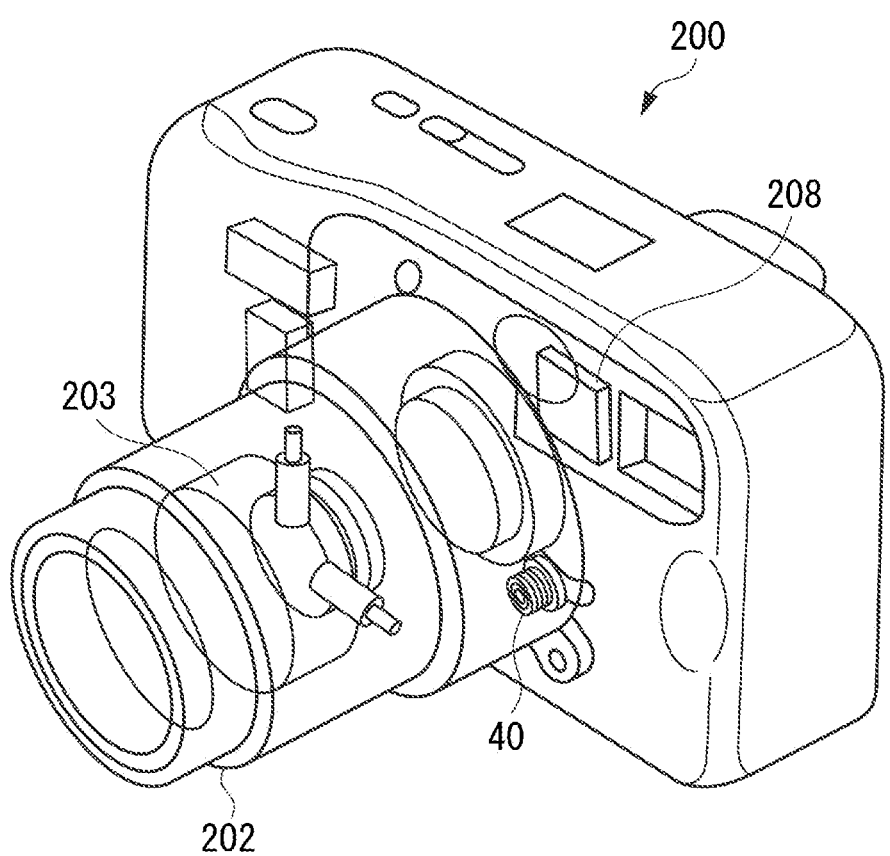
FIG. 7 is a perspective view illustrating an overall structure of a digital camera (imaging apparatus) as an example of an optical apparatus of the disclosure.

FIG. 7 is a perspective view illustrating an overall structure of a digital camera (imaging apparatus) 200 as an example of an optical apparatus of the disclosure.

A lens barrel 202 is attached to the front face of the digital camera 200. A lens 209 and a camera-shake correction optical system 203 are disposed inside the lens barrel 202.

The main body of the digital camera 200 is provided with an image sensor 208. When light that passed through the lens barrel 202 is focused on the image sensor 208, an optical image is formed. The image sensor 208 is a photoelectric conversion device such as a complementary metal-oxide-semiconductor (CMOS) sensor and charge coupled device (CCD) sensor that converts an optical image into an analog electrical signal. The analog electrical signal output from the image sensor 208 is converted into a digital signal by an analog-to-digital (A/D) converter (not illustrated). The digital signal undergoes predetermined image processing by an image processing circuit (not illustrated) and is stored in a storage media such as a semiconductor memory (not illustrated) as image data (video data).

The lens barrel 202 is provided with a lens group (not illustrated) movable in the optical axis direction. The vibration wave motor 40 mechanically connected to an optical member such as the lens barrel 202 via a gear train (not illustrated) drives the lens group disposed in the lens barrel 202. The vibration wave motor 40 can be used to drive a zoom lens and focusing lens in the digital camera 200.

A digital camera as an optical apparatus of the disclosure has been described above. The disclosure is applicable to an interchangeable lens barrel of a single-lens reflex camera, compact camera, electronic still camera, portable information terminal with a camera, and any other types of cameras. The disclosure is widely applicable to optical apparatuses having a vibration wave motor in a drive unit.

An electronic apparatus of the disclosure includes the above-described laminated-piezoelectric vibrator.

Figure 8A:
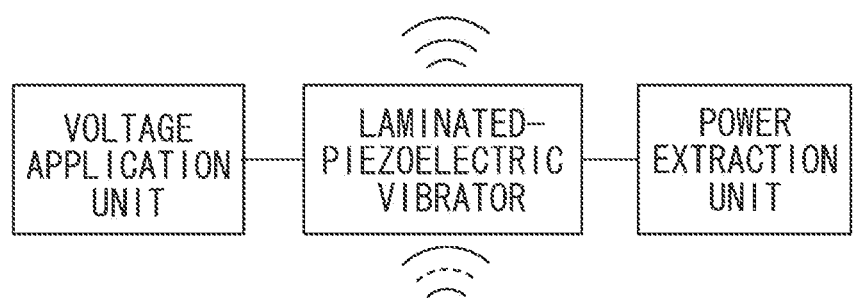
FIGS. 8A, 8B, and 8C are conceptual views illustrating an electronic apparatus according to an exemplary embodiment of the disclosure.
Figure 8B:
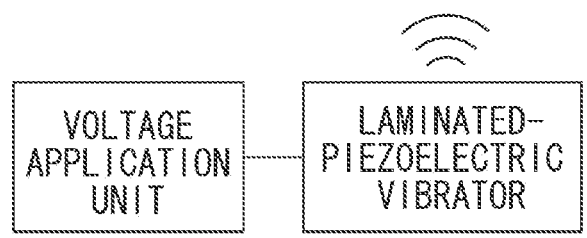
Figure 8C:
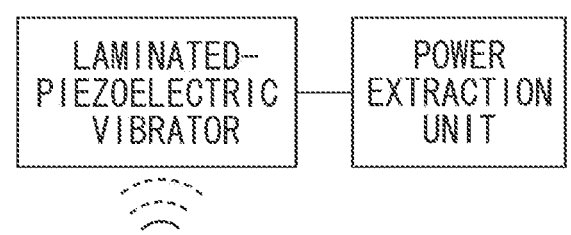

FIGS. 8A, 8B, and 8C are conceptual views illustrating the electronic apparatus according to an exemplary embodiment of the disclosure.

The laminated-piezoelectric vibrator of the disclosure is applicable to electronic apparatuses such as a liquid discharge head, vibration apparatus, piezoelectric sound collection apparatus, piezoelectric sound generation apparatus, piezoelectric actuator, piezoelectric sensor, piezoelectric transformer, ferroelectric memory, and power generation apparatus.

As illustrated in FIGS. 8A, 8B, and 8C, the electronic apparatus of the disclosure includes the laminated-piezoelectric vibrator of the disclosure and may desirably include at least one of a voltage application unit for supplying power to the laminated-piezoelectric vibrator and a power extraction unit. "Power extraction" may be any one of an action for collecting electric energy and an action for receiving an electric signal. Vibration of the laminated-piezoelectric vibrator generated by the voltage application unit is used by the electronic apparatus to exhibit its function. Alternatively, the power extraction unit detects power generated by the laminated-piezoelectric vibrator vibrated by an external action, and the electronic apparatus utilizes the vibration to exhibit its function.

Although exemplary embodiments of the disclosure will be described in more detail below, the disclosure is not limited thereto.

(Production of Laminated-Element and Laminated-Piezoelectric Vibrator)

According to a first exemplary embodiment, a powdered barium titanate-based material was prepared as a starting material of piezoelectric material layers.

More specifically, barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.13, the value of a ratio y of the content of Zr to the sum of the contents (mol) of Ti and Zr was set to 0.03, and the content of Mn was set to 0.30 parts by mass to 100 parts by mass of an oxide containing Ba, Ca, Ti, and Zr in terms of metal. This mixed powder was calcined at 900° C. for 4 hours, and calcined powder made of a barium titanate-based material was obtained.

0.1 parts by mass of an auxiliary agent was added to 100 parts by mass of the calcined powder. A mixture of particulate $SiO_2$, $B_2O_3$, $Al_2O_3$, and $Na_2CO_3$ with an average particle diameter of 1.0 μm was used as the auxiliary agent. The weight ratio of $SiO_2$, $B_2O_3$, $Al_2O_3$, and $Na_2CO_3$ contained in the auxiliary agent was set to 5:2:2:1 as an anhydride.

Then, the calcined powder with the auxiliary agent mixed, the binder (PVB), and a dispersing agent were added to water, which is a solvent, to obtain a slurry.

Using the obtained slurry, a green sheet with a 60-μm thickness was obtained through the doctor blade method. Small holes are formed as through-holes on the above-described green sheet, and the holes were filled up with a conductive paste. The conductive paste for forming metal electrode layers was printed on the surface of the above-described green sheet. A paste of an alloy containing 50 percent silver (Ag) and 50 percent palladium (Pd) (Ag/Pd=1.0) was used as the conductive paste. A total of 36 green sheets with the conductive paste printed thereon were stacked in layers on top of each other, and the laminated body was baked at the maximum temperature 1250° C. for 5 hours. Thus, a sintered product was obtained.

The composition of the piezoelectric material portion of the sintered product obtained in this way was evaluated through ICP optical emission spectroscopy. As a result, it was found that the main component of the piezoelectric material is a metal oxide which is represented by a chemical formula $(Ba_{0.87}Ca_{0.13})(Ti_{0.97}Zr_{0.03})O_3$ and that 0.30 parts by mass of Mn is contained for 100 parts by mass of the main component. For each of the Ba, Ca, Ti, Zr, and Mn components, the weighed composition and the composition after sintering were the same.

After cutting the sintered product, the poling procedure was performed on two metal electrodes in the 180-degree positional relation out of the four division metal electrodes at 135° C. in an electric field with 1.4 kV/mm for 30 minutes so that the polarization direction is different between the two metal electrodes. As a result, the piezoelectric element 10 according to the first exemplary embodiment as illustrated in FIG. 1 was obtained.

The obtained piezoelectric element 10 had an outer diameter of 6 mm, an inner diameter of 2 mm, a thickness of 2.0 mm, 36 piezoelectric material layers (each with a thickness of 55 μm), 35 metal electrodes (each with an outer diameter of 9.5 mm and a thickness of 5 μm), and through-holes (each with a diameter of 0.1 mm).

Subsequently, a laminated-piezoelectric vibrator as illustrated in FIG. 5 was produced by using the obtained piezoelectric element 10.

First of all, a primer treatment was performed on the piezoelectric element 10 to bond the piezoelectric element 10 to the first elastic member 21 by pressure. Subsequently, an electric wiring including a flexible printed circuit board was sandwiched between the second elastic member 22 and the surface of the piezoelectric element 10 to which the first elastic member 21 is not attached. Finally, the shaft 24 was inserted into the piezoelectric element 10, the first elastic member 21, and the second elastic member 22, and then the first nut 25 was fastened by pressure with torque of 3 kgf·m. Thus, the laminated-piezoelectric vibrator according to the first exemplary embodiment was obtained.

A laminated-piezoelectric vibrator according to a second exemplary embodiment was obtained through similar processes to the first exemplary embodiment except that the first nut 25 was fastened by pressure with torque of 2 kgf·m.

A laminated-piezoelectric vibrator according to a third exemplary embodiment was obtained through similar processes to the first exemplary embodiment except that the first nut 25 was fastened by pressure with torque of 4 kgf·m.

A laminated-piezoelectric vibrator according to a fourth exemplary embodiment was obtained through similar processes to the first exemplary embodiment except the following points.

(1) Barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.10, the value of a ratio y of the content of Zr to the sum of the contents (mol) of Ti and Zr was set to 0.07, and the content of Mn was set to 0.20 parts by mass to 100 parts by mass of an oxide containing Ba, Ca, Ti, and Zr in terms of metal.

(2) A paste of an alloy containing 40 percent silver (Ag) and 60 percent palladium (Pd) (Ag/Pd=0.67) was used as the conductive paste.

(3) A sintered product was obtained by baking the laminated body at the maximum temperature 1280° C. for 5 hours.

A laminated-piezoelectric vibrator according to a fifth exemplary embodiment was obtained through similar processes to the fourth exemplary embodiment except the following points.

(1) Barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.20, the value of a ratio y of the content of Zr to the sum of the contents (mol) of Ti and Zr was set to 0.03, and the content of Mn was set to 0.10 parts by mass to 100 parts by mass of an oxide containing Ba, Ca, Ti, and Zr in terms of metal.

A laminated-piezoelectric vibrator according to a sixth exemplary embodiment was obtained through similar processes to the fourth exemplary embodiment except the following points.

(1) Barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.10, the value of a ratio y of the content of Zr to the sum of the contents (mol) of Ti and Zr was set to 0.05, and the content of Mn was set to 0.40 parts by mass to 100 parts by mass of an oxide containing Ba, Ca, Ti, and Zr in terms of metal.

According to a first comparative example, a powdered barium titanate-based material was prepared as a starting material of piezoelectric material layers.

More specifically, barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.08, the value of a ratio y of the content of Zr to the sum of the contents (mol) of Ti and Zr was set to 0.07, and the content of Mn was set to 0.18 parts by mass to 100 parts by mass of an oxide containing Ba, Ca, Ti, and Zr in terms of metal. This mixed powder was calcined at 900° C. for 4 hours, and calcined powder made of a barium titanate-based material was obtained.

0.1 parts by mass of an auxiliary agent was added to 100 parts by mass of the calcined powder. A mixture of particulate $SiO_2$, $B_2O_3$, $Al_2O_3$, and $Na_2CO_3$ with an average particle diameter of 1.0 μm was used as the auxiliary agent. The weight ratio of $SiO_2$, $B_2O_3$, $Al_2O_3$, and $Na_2CO_3$ contained in the auxiliary agent was set to 5:2:2:1.

Then, the calcined powder with the auxiliary agent mixed, the binder (PVB), and a dispersing agent were added to water, which is a solvent, to obtain a slurry.

Using the obtained slurry, a green sheet with a 60-μm thickness was obtained through the doctor blade method. Small holes were formed as through-holes on the above-described green sheet, and the holes were filled up with a conductive paste. The conductive paste for forming metal electrode layers was printed on the surface of the above-described green sheet. A paste of an alloy containing 50 percent silver (Ag) and 50 percent palladium (Pd) (Ag/Pd=1.0) was used as the conductive paste. A total of 36 green sheets with the conductive paste printed thereon were stacked in layers on top of each other, and the laminated body was baked at the maximum temperature 1200° C. for 5 hours. Thus, a sintered product was obtained.

The composition of the piezoelectric material portion of the sintered product obtained in this way was evaluated through ICP optical emission spectroscopy. As a result, it was found that the main component of the piezoelectric material is a metal oxide which is represented by a chemical formula $(Ba_{0.92}Ca_{0.08})(Ti_{0.93}Zr_{0.07})O_3$ and that 0.18 parts by mass of Mn is contained for 100 parts by mass of the main component. For each of the Ba, Ca, Ti, Zr, and Mn components, the weighed composition and the composition after sintering were the same.

After cutting the sintered product, the poling procedure was performed on two metal electrodes in the 180-degree positional relation out of the four division metal electrodes at 135° C. in an electric field with 1.4 kV/mm for 30 minutes so that the polarization direction is different between the two metal electrodes. As a result, the piezoelectric element 10 according to the first comparative example as illustrated in FIG. 1 was obtained.

The obtained piezoelectric element 10 had an outer diameter of 6 mm, an inner diameter of 2 mm, a thickness of 2.0 mm, 36 piezoelectric material layers (each with a thickness of 55 μm), 35 metal electrodes (each with an outer diameter of 9.5 mm and a thickness of 2 to 3 μm), and through-holes (each with a diameter of 0.1 mm).

Subsequently, a laminated-piezoelectric vibrator as illustrated in FIG. 5 was produced by using the obtained piezoelectric element 10.

First of all, a primer treatment was performed on the piezoelectric element 10 to bond the piezoelectric element 10 to the first elastic member 21 by pressure. Subsequently, an electric wiring including a flexible printed circuit board was sandwiched between the second elastic member 22 and the surface of the piezoelectric element 10 to which the first elastic member 21 is not attached. Finally, the shaft 24 was inserted into the piezoelectric element 10, the first elastic member 21, and the second elastic member 22, and then the first nut 25 was fastened by pressure with torque of 3 kgf·m. Thus, the laminated-piezoelectric vibrator according to the first comparative example was obtained.

A laminated-piezoelectric vibrator according to a second comparative example was obtained through similar processes to the first comparative example except the following points.

(1) Barium carbonate ($BaCO_3$), calcium carbonate ($CaCO_3$), titanium oxide ($TiO_2$), zirconium dioxide ($ZrO_2$), and trimanganese tetroxide ($Mn_3O_4$) were weighed and mixed. In this process, the value of a ratio x of the content of Ba to the sum of the contents (mol) of Ba and Ca was set to 0.13, the value of a ratio y of the content of Zr to the sum of the contents (mol) of Ti and Zr was set to 0.03, and the content of Mn was set to 0.20 parts by mass to 100 parts by mass of an oxide containing Ba, Ca, Ti, and Zr in terms of metal.

(2) A paste of an alloy containing 60 percent silver (Ag) and 40 percent palladium (Pd) (Ag/Pd=1.5) was used as the conductive paste.

(3) The poling procedure was not performed on the laminated body.

A laminated-piezoelectric vibrator according to a third comparative example was obtained through similar processes to the first comparative example except the following points.

(1) Barium carbonate ($BaCO_2$), calcium carbonate ($CaCO_3$), titanium oxide ($TiO_2$), and zirconium dioxide ($ZrO_2$) were weighed and mixed. In this process, the value of a ratio x of the content of Ba to the sum of the contents (mol) of Ba and Ca was set to 0.02, and the value of a ratio y of the content of Zr to the sum of the contents (mol) of Ti and Zr was set to 0.05.

(2) A paste of an alloy containing 40 percent silver (Ag) and 60 percent palladium (Pd) (Ag/Pd=0.67) was used as the conductive paste.

(3) A sintered product was obtained by baking the laminated body at the maximum temperature 1300° C. for 5 hours.

A laminated-piezoelectric vibrator according to a fourth comparative example was obtained through similar processes to the third comparative example except the following points.

(1) Barium carbonate ($BaCO_3$), calcium carbonate ($CaCO_3$), titanium oxide ($TiO_2$), and zirconium dioxide ($ZrO_2$) were weighed and mixed. In this process, the value of a ratio x of the content of Ba to the sum of the contents (mol) of Ba and Ca was set to 0.08, and the value of a ratio y of the content of Zr to the sum of the contents (mol) of Ti and Zr was set to 0.05.

A laminated-piezoelectric vibrator according to a fifth comparative example was obtained through similar processes to the third comparative example except the following points.

(1) Barium carbonate ($BaCO_3$), calcium carbonate ($CaCO_3$), titanium oxide ($TiO_2$), and zirconium dioxide ($ZrO_2$) were weighed and mixed. In this process, the value of a ratio x of the content of Ba to the sum of the contents (mol) of Ba and Ca was set to 0.20, and the value of a ratio y of the content of Zr to the sum of the contents (mol) of Ti and Zr was set to 0.05.

Manufacturing conditions for the first to the sixth exemplary embodiments and the first to the fifth comparative examples are summarized in Table 1.

TABLE 1

| | Composition of piezoelectric material layers | Composition of metal electrode layers | Maximum baking temperature |
|---|---|---|---|
| First exemplary embodiment | $(Ba_{0.87}Ca_{0.13})(Ti_{0.97}Zr_{0.03})O_3$—Mn0.30 | Ag:Pd = 5:5 | 1250° C. |
| Second exemplary embodiment | $(Ba_{0.87}Ca_{0.13})(Ti_{0.97}Zr_{0.03})O_3$—Mn0.30 | Ag:Pd = 5:5 | 1250° C. |
| Third exemplary embodiment | $(Ba_{0.87}Ca_{0.13})(Ti_{0.97}Zr_{0.03})O_3$—Mn0.30 | Ag:Pd = 5:5 | 1250° C. |
| Fourth exemplary embodiment | $(Ba_{0.92}Ca_{0.10})(Ti_{0.93}Zr_{0.07})O_3$—Mn0.20 | Ag:Pd = 4:6 | 1280° C. |
| Fifth exemplary embodiment | $(Ba_{0.92}Ca_{0.20})(Ti_{0.93}Zr_{0.03})O_3$—Mn0.10 | Ag:Pd = 4:6 | 1280° C. |
| Sixth exemplary embodiment | $(Ba_{0.92}Ca_{0.10})(Ti_{0.95}Zr_{0.05})O_3$—Mn0.40 | Ag:Pd = 4:6 | 1280° C. |
| First comparative example | $(Ba_{0.92}Ca_{0.08})(Ti_{0.93}Zr_{0.07})O_3$—Mn0.18 | Ag:Pd = 5:5 | 1200° C. |
| Second comparative example | $(Ba_{0.87}Ca_{0.13})(Ti_{0.97}Zr_{0.03})O_3$—Mn0.30 | Ag:Pd = 6:4 | 1200° C. |
| Third comparative example | $(Ba_{0.98}Ca_{0.02})(Ti_{0.95}Zr_{0.05})O_3$ | Ag:Pd = 4:6 | 1300° C. |
| Fourth comparative example | $(Ba_{0.92}Ca_{0.08})(Ti_{0.95}Zr_{0.05})O_3$ | Ag:Pd = 4:6 | 1300° C. |
| Fifth comparative example | $(Ba_{0.80}Ca_{0.20})(Ti_{0.95}Zr_{0.05})O_3$ | Ag:Pd = 4:6 | 1300° C. |

(Evaluation of Laminated-Element and Laminated-Piezoelectric Vibrator)

The polarization-field hysteresis characteristics of the obtained laminated-piezoelectric vibrator were evaluated by using a ferroelectric evaluation apparatus (product name FCE-1 from TOYO Corporation).

A triangle-wave voltage with an amplitude of $\pm 110$ $V_{p0}$ and a frequency of 1 Hz was applied to the laminated-piezoelectric vibrator. The relation between the polarization quantity and the electric field obtained by the voltage application were measured 10 times, and evaluation parameters in the polarization-field hysteresis characteristics were calculated based on the average value. A voltage amplitude of $\pm 110$ $V_{p0}$ means that the applied field was swept from $-20$ to 20 kV/cm.

The polarization-field hysteresis characteristics were evaluated based on the following items.
(Item 1) Field polarity of two coercive fields
(Item 2) Difference between two coercive fields Ec1 and Ec2 (|Ec2|−|Ec1|)
(Item 3) Value of |Ec2|
(Item 4) Area S of hysteresis loop having field polarity different from field polarity in which two coercive fields are located
(Item 5) Absolute value of difference between maximum value Pmax and minimum value Pmin (|Pmax−Pmin|) of polarization quantity in field polarity in which two coercive fields are located
(Item 6) Product of (|Ec2|−|Ec1|) and (|Pmax−Pmin|)

The polarization-field hysteresis characteristics according to the first to the sixth exemplary embodiments and the first to the fifth comparative examples were summarized in Table 2.

Figure 9A:
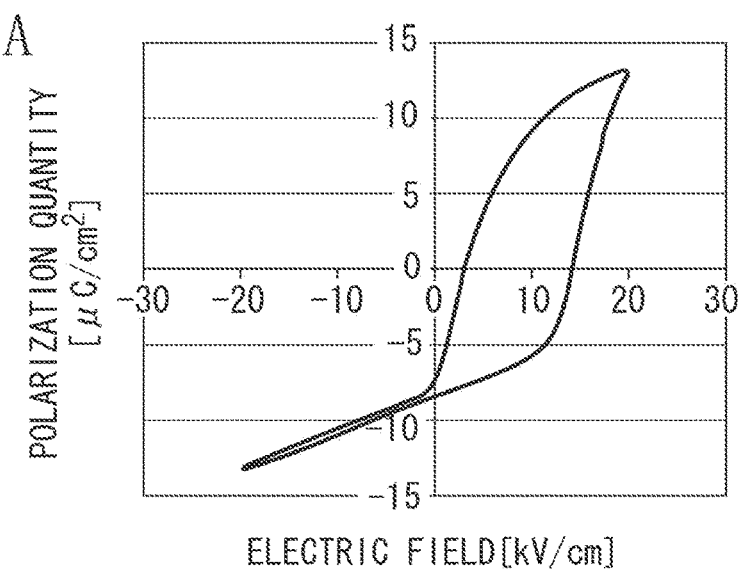
FIGS. 9A, 9B, and 9C illustrate the polarization-field hysteresis characteristics of piezoelectric elements according to a first to a third exemplary embodiment of the disclosure.
Figure 9B:
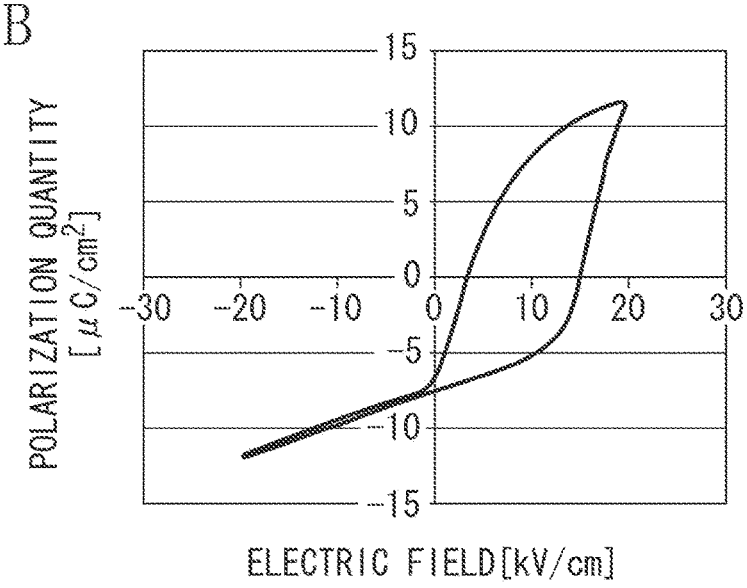
Figure 9C:
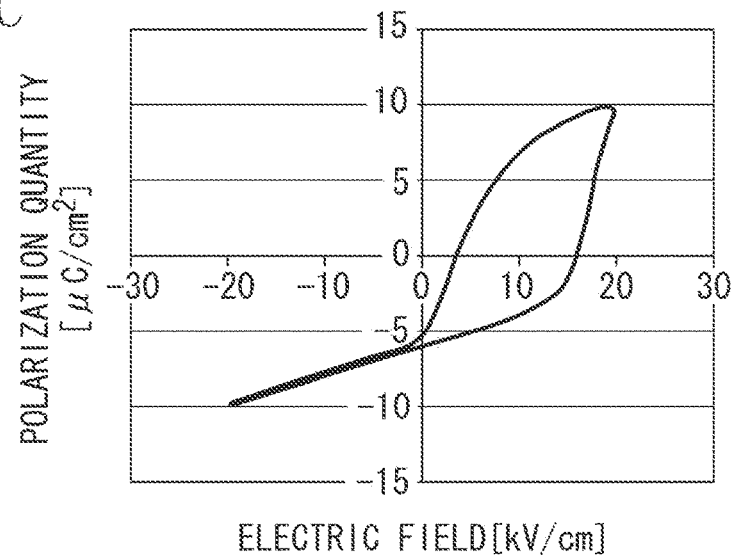
Figure 10A:
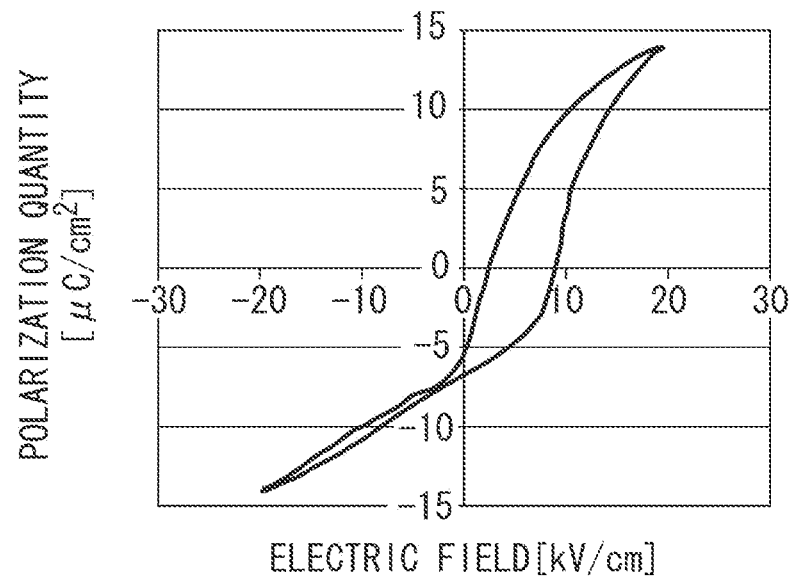
FIGS. 10A and 10B illustrate the polarization-field hysteresis characteristics of piezoelectric elements according of a first and a second comparative example of the disclosure.
Figure 10B:
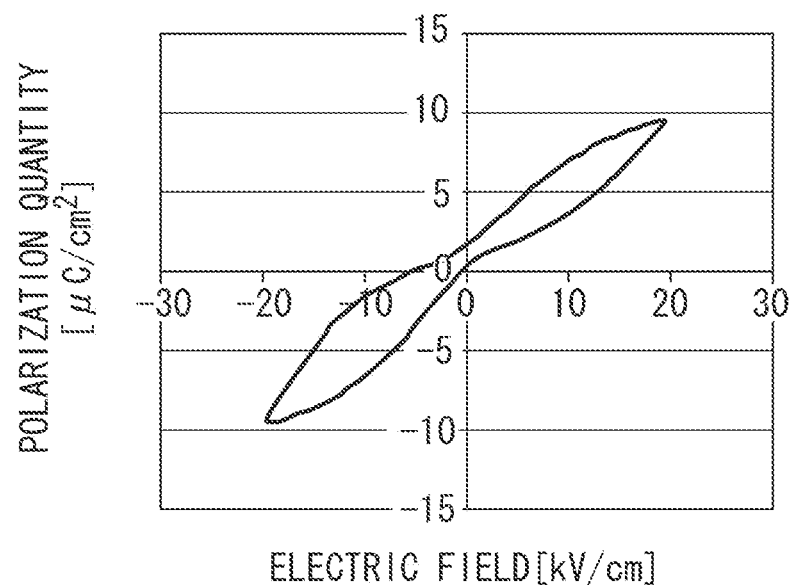

FIGS. 9A, 9B, and 9C illustrate waveforms of the polarization-field hysteresis characteristics according to the first, the second, and the third exemplary embodiments, respectively. FIGS. 10A and 10B illustrate waveforms of the polarization-field hysteresis characteristics according to the first and the second comparative examples, respectively.

TABLE 2

| | (Item 1) Field polarity | (Item 2) (|Ec2| − |Ec1|) [kV/cm] | (Item 3) |Ec2| [kV/cm] |
|---|---|---|---|
| First exemplary embodiment | Positive only | 11.1 | 14.0 |
| Second exemplary embodiment | Positive only | 11.7 | 15.0 |
| Third exemplary embodiment | Positive only | 12.3 | 15.9 |
| Fourth exemplary embodiment | Positive only | 8.1 | 11.5 |
| Fifth exemplary embodiment | Positive only | 14.0 | 16.0 |
| Sixth exemplary embodiment | Positive only | 10.1 | 13.2 |
| First comparative example | Positive only | 6.5 | 9.0 |
| Second comparative example | Negative only | 4.7 | −0.5 |
| Third comparative example | Positive and negative | 5.0 | 2.5 |
| Fourth comparative example | Positive and negative | 9.4 | 4.7 |
| Fifth comparative example | Positive and negative | 15.0 | 7.5 |

TABLE 2-continued

|  | (Item 4) S [mV·C/m³] | (Item 5) \|Pmax − Pmin\| [μC/cm²] | (Item 6) (\|Ec2\| − \|Ec1\|) · (\|Pmax − Pmin\|) [kV·C/m³] |
|---|---|---|---|
| First exemplary embodiment | 3.9 | 20.5 | 227 |
| Second exemplary embodiment | 3.2 | 18.2 | 213 |
| Third exemplary embodiment | 2.7 | 15.2 | 187 |
| Fourth exemplary embodiment | 4.1 | 28.7 | 232 |
| Fifth exemplary embodiment | 5.2 | 12.6 | 176 |
| Sixth exemplary embodiment | 6.1 | 22.1 | 223 |
| First comparative example | 7.5 | 19.9 | 128 |
| Second comparative example | 41.9 | 9.2 | 43 |
| Third comparative example | 71.0 | 21.0 | 105 |
| Fourth comparative example | 142.0 | 30.0 | 282 |
| Fifth comparative example | 135.2 | 20.5 | 308 |

As illustrated in Table 2, according to the first to the sixth exemplary embodiments, the field polarity of the two coercive fields was only positive. According to the first to the sixth exemplary embodiments, the difference between the two coercive fields Ec1 and Ec2 (|Ec2|−|Ec1|) was 8 kV/cm or more. According to the first to the sixth exemplary embodiments, the value of |Ec2| was 10 kV/cm or more. According to the first to the fourth exemplary embodiments, the area S of a hysteresis loop having the field polarity different from the field polarity in which the two coercive fields are located was 5 mV·C/m³ or less. According to the first to the fourth and the sixth exemplary embodiments, the absolute value of the difference between the maximum value Pmax and the minimum value Pmin (|Pmax−Pmin|) of the polarization quantity in the field polarity in which the two coercive fields are located was 15 μC/cm² or more. According to the first to the sixth exemplary embodiments, the product of (|Ec2|−|Ec1|) and (|Pmax−Pmin|) was 120 kV·C/m³ or more.

According to the first and the second comparative examples, the difference between the coercive fields Ec1 and Ec2 (|Ec2|−|Ec1|) was less than 8.0 kV. According to the third to the fifth comparative examples, the field polarities of the two coercive fields were positive and negative.

(Vibration Wave Motor)

A vibration wave motor according to the seventh to the twelfth exemplary embodiments as illustrated in FIG. 6 was produced by using the laminated-piezoelectric vibrator according to the first to the sixth exemplary embodiments, rubber, moving member, gear, pressurization spring, flange, and second nut.

The produced vibration wave motor was rotatably driven by applying an alternating voltage of 15 Vrms to each of the phases A and B of the vibration wave motor so that a 90-degree phase difference is produced. Then, the motor power at 700 rpm was measured by using a wattmeter. Results of this measurement are illustrated in Table 3.

A vibration wave motor according to the sixth to the tenth comparative examples as illustrated in FIG. 6 was produced by using the laminated-piezoelectric vibrator according to the first to the fifth comparative examples, rubber, moving member, gear, pressurization spring, flange, and second nut.

The produced vibration wave motor was rotatably driven by applying an alternating voltage of 15 Vrms to each of the phases A and B of the vibration wave motor with a load of 50 gf·cm so that a 90-degree phase difference is produced. Then, the power consumption at 700 rpm was measured by using a wattmeter. Results of this measurement are illustrated in Table 3.

TABLE 3

| Vibration wave motor | Laminated piezoelectric vibrator | Power consumption at 700 rpm [W] |
|---|---|---|
| Seventh exemplary embodiment | First exemplary embodiment | 1.5 |
| Eighth exemplary embodiment | Second exemplary embodiment | 1.4 |
| Ninth exemplary embodiment | Third exemplary embodiment | 1.3 |
| Tenth exemplary embodiment | Fourth exemplary embodiment | 1.7 |
| Eleventh exemplary embodiment | Fifth exemplary embodiment | 1.5 |
| Twelfth exemplary embodiment | Sixth exemplary embodiment | 1.6 |
| Sixth comparative example | First comparative example | 2.3 |
| Seventh comparative example | Second comparative example | 700 rpm not reached |
| Eighth comparative example | Third comparative example | 2.8 |
| Ninth comparative example | Fourth comparative example | 2.6 |
| Tenth comparative example | Fifth comparative example | 2.5 |

As illustrated in Table 3, the power consumption at 700 rpm according to the seventh to the twelfth exemplary embodiments was less than 2.0 W, and the power consumption at 700 rpm according to the sixth, the eighth, the ninth, and the tenth comparative examples was 2.3 W or more. According to the seventh comparative example, the maximum speed did not reach 700 rpm.

(Optical Apparatus)

An optical apparatus according to the thirteenth exemplary embodiment as illustrated in FIG. 7 was produced by mechanically connecting the vibration wave motor according to the seventh exemplary embodiment with an optical member. An optical apparatus according to the eleventh comparative example as illustrated in FIG. 7 was produced by mechanically connecting the vibration wave motor according to the sixth exemplary embodiment with an optical member. An auto focusing operation according to alternating voltage application was confirmed for both optical apparatuses. The focusing operation according to the thirteenth exemplary embodiment provided smaller power consumption than the focusing operation according to the eleventh comparative example.

(Electronic Apparatus)

Figure 11:
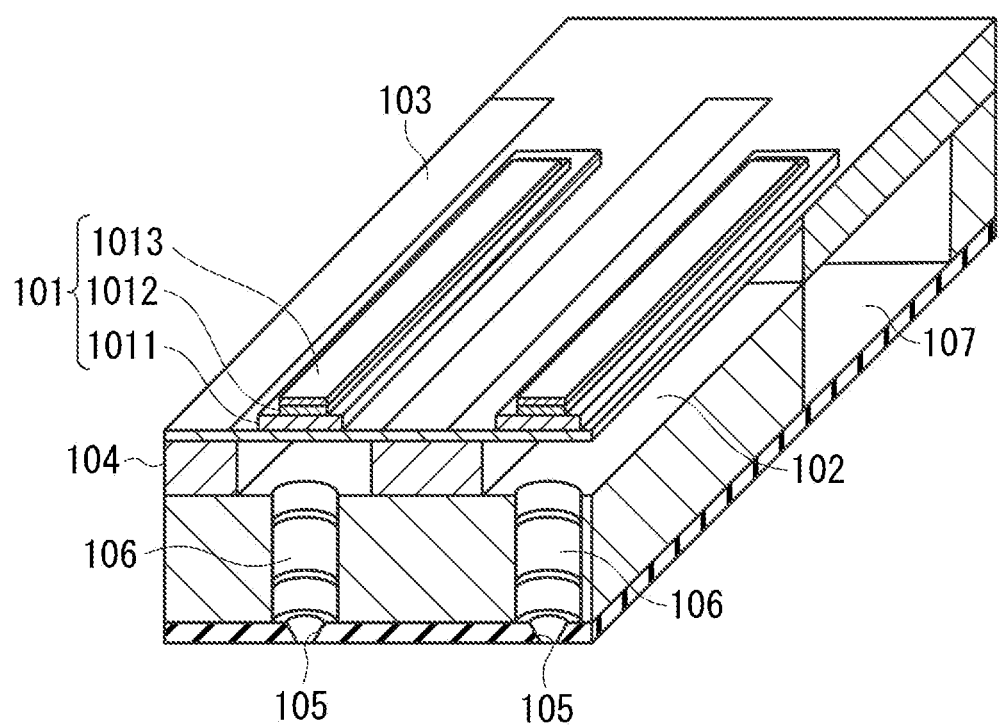
FIG. 11 is a schematic view illustrating a structure of a liquid discharge head as an exemplary embodiment of the electronic apparatus of the disclosure.

A liquid discharge head illustrated in FIG. 11 was produced by using the piezoelectric element according to the first exemplary embodiment. The liquid discharge head illustrated in FIG. 11 includes a piezoelectric element 101 (including an electrode 1011, a laminated portion 1012, and an electrode 1013) according to exemplary embodiments. The liquid discharge head further includes a discharge port 105, an individual liquid chamber 102, a communication hole 106 for connecting the individual liquid chamber 102 and the discharge port 105, a liquid chamber partition 104, a common liquid chamber 107, a vibration plate 103, and the piezoelectric element 101. Liquefied ink can be stored in the liquid chambers 102 and 107.

When an electric signal is input to the liquid discharge head, ink discharge following a signal pattern was confirmed. This liquid discharge head was assembled to an ink-jet printer, and ink discharge to recording paper was confirmed.

It was confirmed that the disclosure is applicable to various electronic apparatuses having the piezoelectric element or vibrator of the disclosure.

INDUSTRIAL AVAILABILITY

According to the disclosure, it is possible to provide a piezoelectric element having highly efficient drive characteristics. According to the disclosure, it is also possible to provide a vibrator, vibration wave motor, optical apparatus, and electronic apparatus having highly efficient drive characteristics. The laminated element of the disclosure is applicable to all types of piezoelectric devices using a laminated element.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2017-137179, filed Jul. 13, 2017, which is hereby incorporated by reference herein in its entirety.

What is claimed is:

1. A vibrator comprising:
   a piezoelectric element including a piezoelectric material and an electrode;
     a first elastic member and a second elastic member configured to sandwich the piezoelectric element; and
     a shaft configured to penetrate the piezoelectric element and the first and the second elastic members,
     wherein the piezoelectric material includes a barium titanate-based material,
     wherein two coercive fields Ec1 and Ec2 of the piezoelectric element have the same sign and satisfy $(|Ec2|-|Ec1|) \geq 8$ kV/cm;
     wherein a content of lead of the piezoelectric material is 1000 parts per million or less, and
     wherein pressure torque by which the first elastic member and the second elastic member are configured to be fastened each other is 2 kgf·m or more and 4 kgf·m or less.

2. The vibrator according to claim 1, wherein a value of $|Ec2|$ is 10 kV/cm or more.

3. The vibrator according to claim 1, wherein, in a hysteresis loop of the piezoelectric element, an area S surrounded by a hysteresis loop having a field polarity different from the Ec1 and the Ec2 and an axis of a zero field satisfies $S \leq 5$ mV·C/m³.

4. The vibrator according to claim 1, wherein, in a hysteresis loop of the piezoelectric element, $(|Pmax-Pmin|) \geq 15$ μC/cm² is satisfied where Pmax and Pmin respectively denote a maximum value and a minimum value of a polarization quantity having the same field polarity as the Ec1 and the Ec2.

5. The vibrator according to claim 1, wherein, in a hysteresis loop of the piezoelectric element, the product of $(|Ec2|-|Ec1|)$ and $(|Pmax-Pmin|)$ is 120 kV·C/m³ or more where Pmax and Pmin respectively denote a maximum value and a minimum value of a polarization quantity having a field polarity in which the Ec1 and the Ec2 are located.

6. The vibrator according to claim 1, wherein a plurality of layers of the piezoelectric material and a plurality of layers of the electrode are provided.

7. The vibrator according to claim 1, wherein the barium titanate-based material contains an oxide containing Ba, Ca, Ti and Zr, and Mn.

8. The vibrator according to claim 7,
   wherein a mole ratio x of Ca to a sum of the Ba and the Ca satisfies $0.02 \leq x \leq 0.30$,
   wherein a mole ratio y of Zr to a sum of the Ti and the Zr satisfies $0.01 \leq y \leq 0.10$, and
   wherein a content of the Mn to 100 parts by mass of the oxide is 0.02 parts by mass or more and 0.40 parts by mass or less in terms of metal.

9. A vibration wave motor comprising:
   the vibrator according to claim 1; and
   a moving member configured to contact the vibrator.

10. An optical apparatus comprising:
    the vibration wave motor according to claim 9; and
    an optical member.

11. An electronic apparatus comprising the vibrator according to claim 1.

12. An electronic apparatus comprising the vibrator according to claim 1.

13. The vibrator according to claim 1, wherein the piezoelectric material and the electrode are alternately stacked.

14. The vibrator according to claim 1, wherein a thickness of the piezoelectric material is 20 μm or more and 100 μm or less.

* * * * *